United States Patent
Singerl et al.

(10) Patent No.: US 10,382,073 B2
(45) Date of Patent: Aug. 13, 2019

(54) ANALOG RF PRE-DISTORTER AND NON-LINEAR SPLITTER

(71) Applicant: Infineon Technologies AG, Neubiberg (DE)

(72) Inventors: Peter Singerl, Villach (AT); Thomas Magesacher, Villach (AT); Martin Mataln, Velden (AT)

(73) Assignee: Infineon Technologies AG, Neubiberg (DE)

( * ) Notice: Subject to any disclaimer, the term of this patent is extended or adjusted under 35 U.S.C. 154(b) by 253 days.

(21) Appl. No.: 14/931,195

(22) Filed: Nov. 3, 2015

(65) Prior Publication Data

US 2017/0126261 A1   May 4, 2017

(51) Int. Cl.
  *H04B 1/04*   (2006.01)
  *H03F 1/32*   (2006.01)

(52) U.S. Cl.
  CPC ......... *H04B 1/0475* (2013.01); *H03F 1/3247* (2013.01); *H03F 1/3294* (2013.01); *H03F 2200/102* (2013.01); *H04B 2001/0425* (2013.01)

(58) Field of Classification Search
  CPC .......... H04B 1/0475; H04B 2001/0425; H04L 27/368
  USPC ............................. 375/297; 330/149; 455/101
  See application file for complete search history.

(56) References Cited

U.S. PATENT DOCUMENTS

| | | | |
|---|---|---|---|
| 5,420,536 A | 5/1995 | Faulkner et al. | |
| 6,075,411 A * | 6/2000 | Briffa | H03F 1/3247 330/149 |
| 6,477,477 B1 * | 11/2002 | Thron | H03F 1/3247 702/86 |
| 6,801,086 B1 | 10/2004 | Chandrasekaran | |
| 7,869,543 B2 | 1/2011 | Reddy et al. | |
| 8,331,487 B2 | 12/2012 | Yu et al. | |
| 2002/0101937 A1 * | 8/2002 | Antonio | H03F 1/3241 375/297 |
| 2004/0116083 A1 | 6/2004 | Suzuki et al. | |
| 2004/0136470 A1 * | 7/2004 | DeBruyn | H04L 27/368 375/297 |
| 2008/0008263 A1 * | 1/2008 | Keerthi | H03F 1/02222 375/297 |
| 2008/0039024 A1 | 2/2008 | Ikeda et al. | |

(Continued)

FOREIGN PATENT DOCUMENTS

| | | |
|---|---|---|
| CN | 102075469 A | 5/2011 |
| DE | 602004012976 T2 | 6/2009 |
| EP | 2517362 A1 | 10/2012 |

*Primary Examiner* — Chieh M Fan
*Assistant Examiner* — Fitwi Y Hailegiorgis
(74) *Attorney, Agent, or Firm* — Eschweiler & Potashnik, LLC

(57) ABSTRACT

An RF transmitter arrangement using analog pre-distortion is disclosed. The arrangement includes lower bandwidth circuitry, an analog pre-distorter, and a non-linear amplifier chain. The lower bandwidth circuitry is configured to generate an analog signal. The analog pre-distorter is configured to apply a non-linear distortion to the analog original signal based on a coupled feedback signal in order to generate an RF output signal. The non-linear amplifier chain is configured to amplify the RF output signal to generate a transmission signal relative to the analog original signal. The coupled feedback signal is derived from the transmission signal.

18 Claims, 8 Drawing Sheets

(56) References Cited

U.S. PATENT DOCUMENTS

| | | | |
|---|---|---|---|
| 2008/0225981 A1* | 9/2008 | Reddy | H04L 27/367 375/297 |
| 2011/0151806 A1* | 6/2011 | Kenington | H01Q 3/28 455/101 |
| 2011/0221694 A1 | 9/2011 | Karaoguz | |
| 2013/0235949 A1 | 9/2013 | Jeckeln | |

* cited by examiner

ANALOG RF PRE-DISTORTER AND NON-LINEAR SPLITTER

BACKGROUND

Communication systems often use transmission signals focused around a carrier frequency of a defined channel. Information is conveyed by representing the information with a modulation based on amplitude, phase, frequency and/or combinations thereof. The information is sent by one or more signals over a band of frequencies around the carrier frequency.

A radio frequency (RF) power amplifier is often used for modulations, such as amplitude modulation. The RF power amplifier is required to operate over wide ranges of frequencies and power levels.

Ideally, RF power amplifiers would be linear and have an output that is a linear value of an input. However, RF power amplifiers typically exhibit some type of non-linearity in their behavior. This non-linearity results in non-linear variations of the output signal compared to the input signal. The non-linear variations degrade communications and increase power consumption.

DETAILED DESCRIPTION

Figure 1:
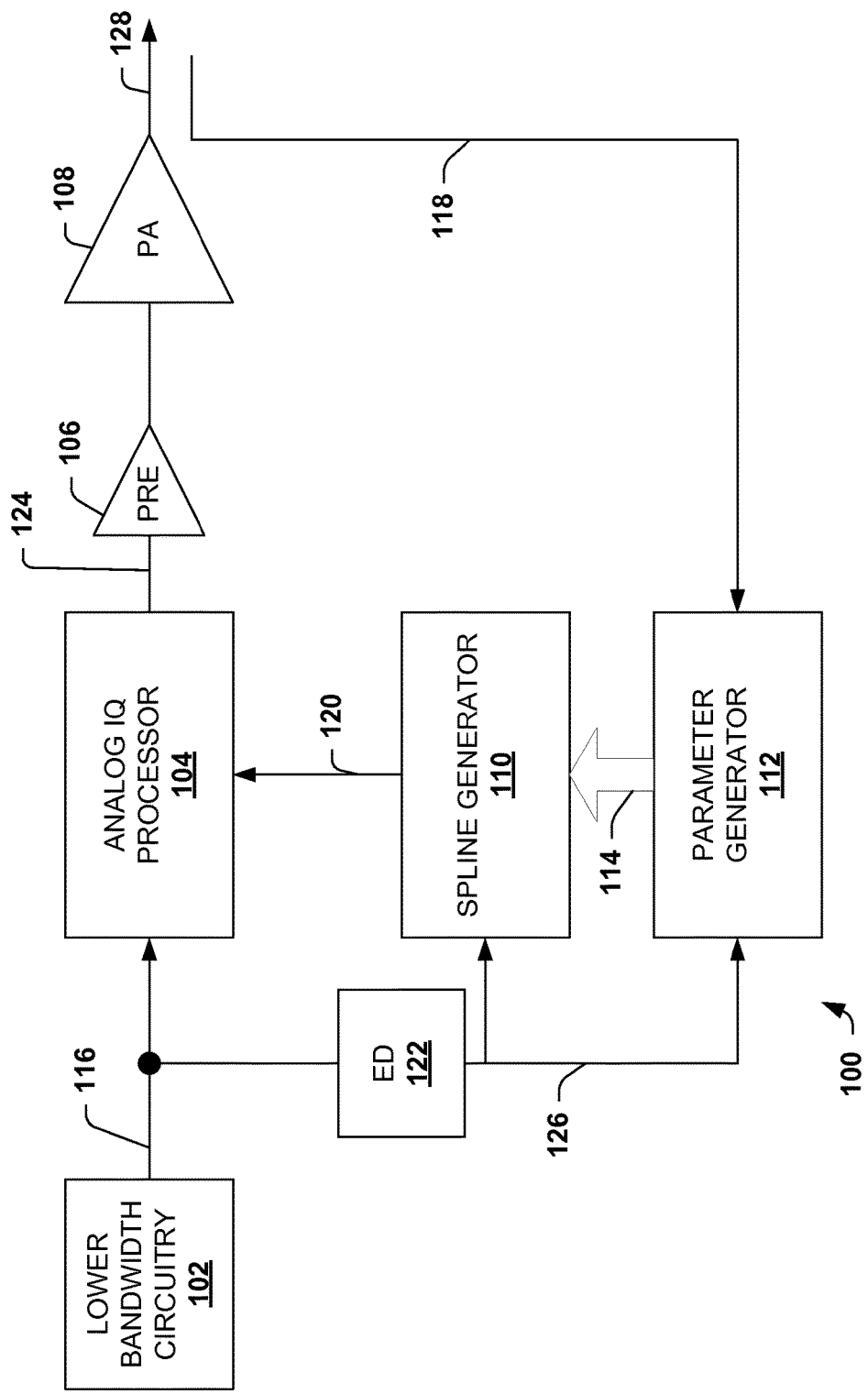
FIG. 1 is a diagram illustrating an RF transmitter system incorporating an analog pre-distorter.

The present invention will now be described with reference to the attached drawing figures, wherein like reference numerals are used to refer to like elements throughout, and wherein the illustrated structures and devices are not necessarily drawn to scale.

Systems, methods, devices and embodiments are provided that incorporate an analog RF pre-distorter for a power amplifier. The analog pre-distorter facilitates that output of the power amplifier by causing the system to be more substantially linear and more linear than a system without a pre-distorter.

A pre-distortion system, also referred to as a pre-distorter, is a system that precedes a non-linear device, such as a power amplifier, in order to linearize a whole system. The linearization can increase electrical efficiency, maintain spectral purity, meet spectral requirements, maintain in-band signal quality and the like.

One technique to accomplish pre-distortion and facilitate linearization is to utilize a digital pre-distorter, which is a non-linear system block implemented in the digital baseband domain of a system, such as a transmitter system. The digital pre-distorter modifies or pre-distorts an input or original signal so that the non-linear device produces a linear or substantially linear output. For example, a cascade of a digital pre-distorter and a non-linear power amplifier provides an output that is a linearly amplified version of an original or input signal.

One of the drawbacks of using a digital pre-distorter is that it further widens or spreads the spectrum of its input signal. As a result components or blocks of the system are required to handle a much higher bandwidth, such as approximately 5 times, in one example than without digital pre-distortion of the original signal. The higher bandwidth requires more expensive components, such as digital to analog converters, mixers, and the like; and results in higher power consumption.

Additionally, the use of a digital pre-distorter in smaller systems, such as smaller base stations, hand held devices and the like can consume so much power that the overall transmitter efficiency suffers from the digital pre-distorter power consumption.

The systems and methods described below utilize an analog pre-distorter that introduces pre-distortion closer to the non-linear device, such as in the RF domain. As a result, baseband components and the analog RF frontend avoid handling a widened or spread spectrum and the higher bandwidth signals that follow. Therefore, the components consume less power than components of systems incorporating digital pre-distorters.

FIG. 1 is a diagram illustrating an RF transmitter system 100 incorporating an analog pre-distorter. The system 100 uses lower bandwidth components than digital pre-distortion systems due to the pre-distortion occurring in the analog domain and closer to the non-linear device. The system 100 can be configured at least partially in circuitry and/or other hardware components. Additionally, the system 100 can be an arrangement.

The system 100 includes lower bandwidth circuitry 102, an analog IQ processor, a pre amplifier 106, an RF power amplifier 108, a spline generator 110, a parameter generator 112 and an envelope detector 122.

The lower bandwidth circuitry 102 generally includes a baseband processor, digital to analog converters and an IQ mixer. The circuitry 102 operates at a lower bandwidth than other RF transmitters because the IQ mixing is done prior to pre-distortion, including digital pre-distortion.

The lower bandwidth circuitry 102 is configured to generate a mixed signal having I (in phase) and Q (90 degree shifted quadrature) components as input signal 116, also referred to as an original signal. The input signal 116 represents information with a modulation based on amplitude, phase, frequency and/or combinations thereof. The spectrum of the input signal 116 is an original spectrum that has not been spread or widened. Additional details of a suitable lower bandwidth circuitry are provided below.

The analog IQ processor 104 is configured to receive the input signal 116 and process the input signal 116 in the analog domain to generate an RF output signal 124. The analog IQ processor 104 divides the input signal 116 into upper and lower orthogonal signals within the processor 104. The upper one is not phase shifted whereas the lower signal is phase shifted by 90 degrees. The processor 104 is configured to pre-distort the upper and lower signals in both magnitude and phase by multiplying each with nonlinear functions or functional. The pre-distorted upper and lower signals are then added to generate the RF output signal 124 that includes the non-linear pre-distortions. The non-linear pre-distortions represent non-linear behavior of the power amplifier 108.

The envelope detector 122 is configured to receive the input signal 116 and detect and provide an envelope 126 of the signal 116. The envelope detector 122 can be implemented, for example, using a rectifier followed by a low-pass filter, however other suitable implementations are contemplated.

The parameter generator 112 is configured to generate pre-distortion parameters according to the envelope 126 and a coupled signal 118. The envelope 126 is provided by the envelope detector 122 and is based on the original signal 116. The coupled signal 118 is a coupled version of an RF output signal 128 generated by the power amplifier 108. A coupler or similar component (not shown) obtains the coupled signal 118 without substantially altering the RF output signal 128.

The parameter generator 112 generates the pre-distortion parameters 114 using a suitable mechanism. Generally, a digital controller circuit (not shown) is used to generate the pre-distortion parameters 114. In one example, a table or memory element within the digital controller circuit is used to provide the parameters 114 based on entries according to the envelope 126 and/or the coupled signal 118. For example, an erasable programmable read-only memory (EPROM) can be used as the memory element or the table. The table and associated parameters 114 can be developed during a calibration and or adaptation process.

In another example, a parameter estimation algorithm is used by the digital controller circuit to generate the pre-distortion parameters 114 based on the coupled signal 118 and the envelope 126. It is appreciated that the pre-distortion parameters 114 can be provided at a relatively low speed, such as less than 1 MHz.

The spline generator 110 is configured to provide one or more non-linear functions/functionals 120, also referred to as splines, to the analog IQ processor 104. The spline generator 110 generates the functions 120 according to the envelope 126 of the original signal 116 and the pre-distortion parameters 114. The non-linear functions 120 model or represent non-linear behavior of the power amplifier or from the inverse of the power amplifier 108.

In one example, the non-linear functions 120 include an upper function and a lower function. The upper function can be for the upper signal or the in-phase component whereas the lower function is for the lower signal or the quadrature component.

The pre-power amplifier 106 applies a pre-amplification to the RF output signal 124. The power amplifier 108 then amplifies the RF signal 124 to generate an RF transmission signal 128. The power amplifier 108 typically introduces non-linearities into the RF transmission signal 128. However, the RF signal 124 has been pre-distorted in the analog domain. The analog pre-distortions results in the transmission signal 128 being substantially linear with respect to the output signal 128 without the analog IQ processor 104. The pre-power amplifier 106 and the power amplifier 108 are also referred to as a power amplifier chain. It is appreciated the chain can omit the pre-amplifier 106 in some variations.

Additionally, it is appreciated that the power amplifier 108 can include variations include, but not limited to, multiple inputs.

As a result, the RF transmitter system 100 produces an RF transmission signal 128 that is substantially linear with respect to the output signal 128 without the analog IQ processor 104. Lower cost and/or complexity circuitry can be used can be used because the circuitry 102 is operating on lower bandwidths. The circuit 102 operates on lower bandwidths because the spectrum of the original signal 116 has not been spread to account for digital pre-distortion, as is the case in other approaches.

Figure 2:
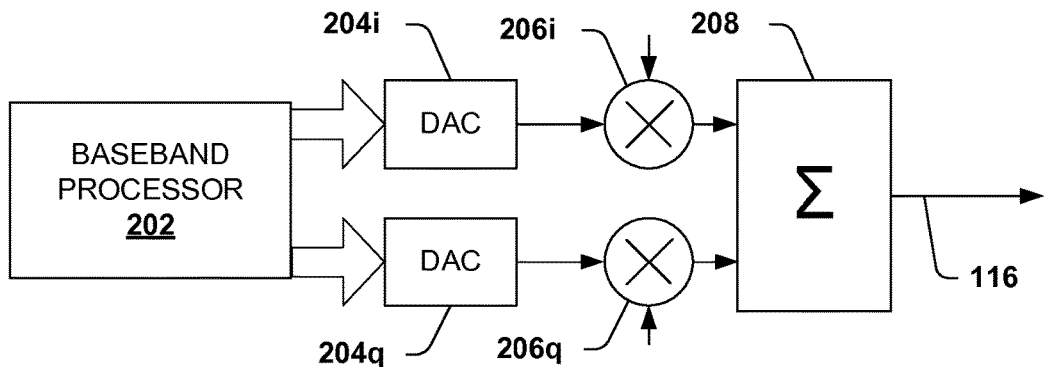
FIG. 2 is a diagram illustrating lower bandwidth circuitry.

FIG. 2 is a diagram illustrating lower bandwidth circuitry 102. The circuitry 102 is provided as an example of suitable circuitry. It is appreciated that suitable variations are contemplated.

The lower bandwidth circuitry 102 generates an analog signal, which is referred to as an input or original signal 116. The circuitry 102 includes a baseband processor 202, digital to analog converters (DAC) 204, mixers 206, and a summation component 208 and other possibly required passive components as e.g. low pass filters which are not explicitly shown in FIG. 2.

The baseband processor 202 generates an upper and lower digital signals. The upper signal is received by an upper DAC 204$i$ and converted to an analog upper signal. The analog upper signal is received by an upper mixer 206$i$ and mixed with an oscillation signal to generate an upper mixed signal.

The lower signal is received by a lower DAC 204$q$ and converted to an analog lower signal. The analog lower signal is received by a lower mixer 206$q$ and mixed with an oscillation signal to generate a lower mixed signal. A summation component 208 adds or sums the upper and lower mixed signals to generate the input signal 116.

The baseband processor 202, the digital to analog converters (DAC) 204, the mixers 206, and the summation component 208 can be implemented with low cost circuitry. The upper and lower signals of the circuitry 102 are at original bandwidths that have not been spread or widened. As a result, the circuitry can be comprised of lower cost components/circuit elements. For comparison, baseband processors involved with digital pre-distortion can require a spectrum spread or bandwidth increase with a factor of 5 or more.

Figure 3:
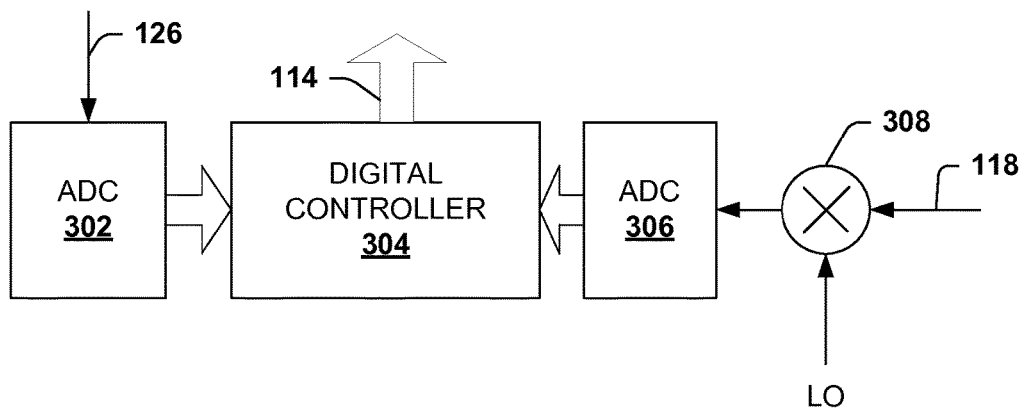
FIG. 3 is a diagram illustrating a parameter generator.

FIG. 3 is a diagram illustrating a parameter generator 112. The parameter generator 112 generates pre-distortion parameters 114 that are used by a spline generator 110. The parameter generator 112 is provided as an example for illustrative purposes and it is appreciated that suitable variations are contemplated.

The parameter generator 112 includes a first analog to digital converter (ADC) 302, a digital controller 304 and a second ADC 306. The first ADC 302 converts an envelope 126 from analog to digital. A mixer 308 mixes the coupled signal 118 with a local oscillator signal (LO) to generate a coupled baseband equivalent power amplifier output signal. The second ADC 306 converts the mixed coupled signal from analog to digital.

The digital controller 304 receives the digital coupled baseband signal and the digital envelope and generates pre-distortion parameters. The controller 304 is configured to generate the pre-distortion parameters 114 based on the digital envelope and the digital mixed coupled signal.

The digital controller 304 can compare the pre-amplified signal, the digital envelop signal, with the digital mixed coupled signal. The digital controller 304 can use a lookup table or similar component to generate the pre-distortion parameters. Alternately, the digital controller 304 can implement a parameter estimation algorithm based on values of the digital envelope signal and the digital mixed coupled signal.

Figure 4:
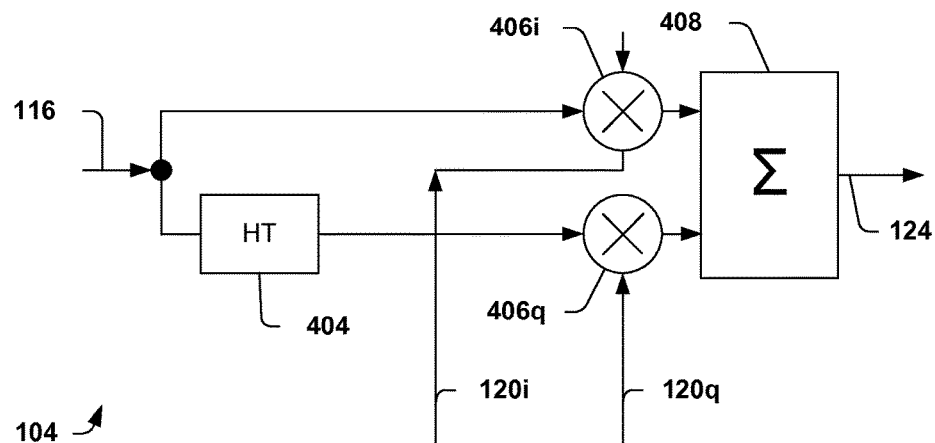
FIG. 4 is a diagram illustrating an analog IQ processor.

FIG. 4 is a diagram illustrating an analog IQ processor 104. The processor 104 is provided as an example and it is appreciated that suitable variations are contemplated.

The analog IQ processor 104 receives an analog signal, the input signal 116, and mixes the input signal with one or more non-linear functions or splines 120. The mixed signals are added and provided as an RF signal 124 for amplification by the pre-amplifier 106 and the power amplifier 108. The RF signal 124 includes non-linear predistortions based on the non-linear functions. The non-linear predistortions estimate and/or represent non-linear behavior of the power amplifier 108.

The analog IQ processor 104 includes a phase shift component 404, an upper mixer 406i, a lower mixer 406q and a summation component 408. The phase shift component 404 shifts the input signal by a number of degrees. In this example, the phase shift component 404 is a Hilbert transformer (HT) and shifts the input signal by 90 degrees.

The upper mixer 406i receives the input signal 116 and mixes the input signal 116 with an upper or in phase non-linear function 120i. The mixed in-phase signal is then received by the summation component 408. Similarly, the lower mixer 406q receives the shifted input signal and mixes the shifted input signal with a lower or quadrature non-linear function 120q. The mixed quadrature signal is also received by the summation component 408. The summation component 408 combines the mixed quadrature signal with the mixed in-phase signal to generate the RF signal 124.

Figure 5:
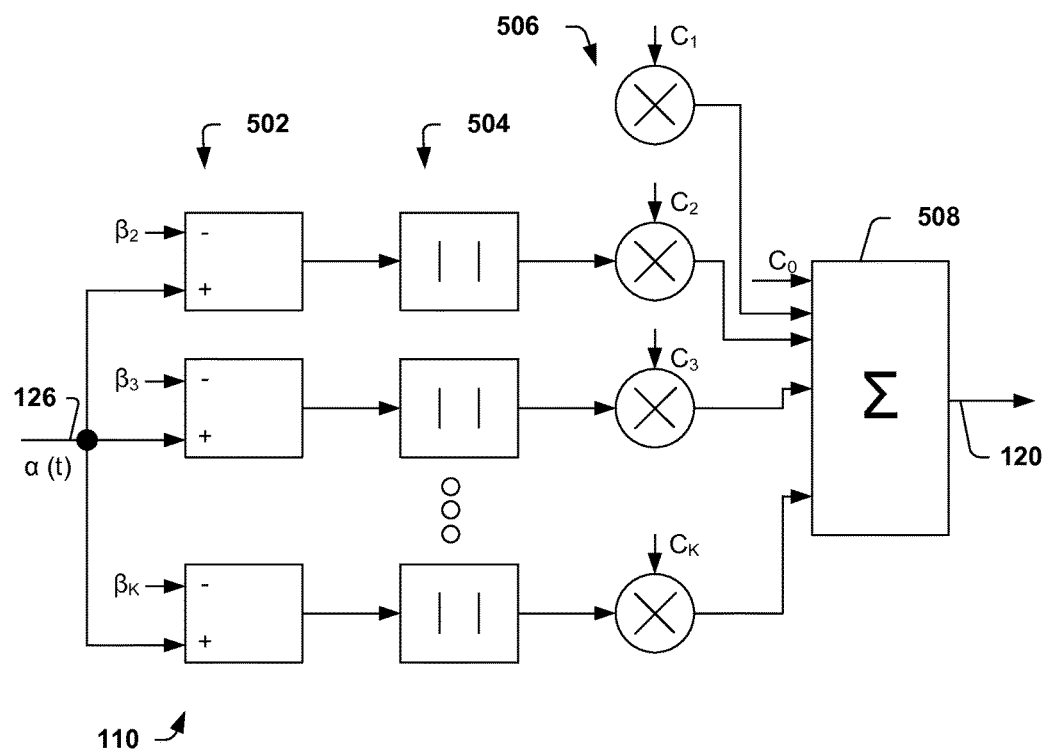
FIG. 5 is a diagram illustrating a spline generator.

FIG. 5 is a diagram illustrating a spline generator 110. The spline generator 110 is an example of a suitable spline generator that can be used with the RF transmitter system 100 of FIG. 1. It is appreciated that suitable variations of the spline generator 110 are contemplated.

The spline generator 110 receives an envelope 126 of an original signal 116 and generates one or more non-linear functions 120. The non-linear functions 120 are also referred to as splines. The non-linear functions 120 are generated based on the envelope 126 and pre-distortion parameters 114 from the parameter generator 112.

The spline generator 126 includes summation components 502, absolute value components 504, mixers 506 and a summation component 508. The summation components 502 each receive the envelope 126 and a different parameter. The outputs of the summation components 502 are received by the absolute value components 504, which generate absolute values.

The mixers 506 combine respective outputs of the absolute value components 504 with additional parameters. The mixed outputs are provided to the summation component 508, which combines the outputs into a non-linear function 120.

FIGS. 1-5 are discussed in combination. The original modulated RF signal 116 generated by the lower bandwidth circuitry 102 is represented by $x(t)=a(t)\cos(\omega_0 t+\varphi(t))$. The original signal 116 is divided into two orthogonal signals within the analog IQ processor 104, an upper signal and a lower signal. The upper signal is unmodified from the original signal 116. The lower signal is phase shifted by 90° with the Hilbert transformer 404 shown in FIG. 4 to get the signal $HT\{x(t)\}=a(t)\sin(\omega_0 t+\varphi(t))$. As a result, the analog IQ processor 104 includes two orthogonal signals that can be nonlinearly pre-distorted in magnitude and phase domain by multiplying the signals by non-linear functions 120 at multipliers 406i and 406q.

The non-linear functions 120 are represented by $f_1(a(t), a(t-\tau_1), \ldots, a(t-\tau_N))$ and $f_2(a(t), a(t-\tau_1), \ldots, a(t-\tau_N))$. Where $f_1$ represents a first non-linear function 120i and $f_2$ represents a second non-linear function 120q. The terms $\tau_N$ represent increasing time delays or memory. The mixed signals are summed by the summation component 408 to generate the pre-distorted RF signal 124. The pre-distortion represents the non-linear behavior of the power amplifier 108 and facilitates generating the RF transmission signal 128 with required linearity and output power. Thus, the pre-distorted RF signal 124 is provided to the pre amplifier 106 and then to the power amplifier 108.

The RF signal 124 can be represented by the formula shown below if the time-dependency from the (low-frequency) baseband signal is removed and described as a function of the magnitude a by $$y(a) = a\sqrt{f_1^2(a) + f_2^2(a)}\, e^{j\left(\varphi + \arctan\left\{\frac{f_2(a)}{f_1(a)}\right\}\right)}$$

which shows that both the magnitude and the phase of the RF-output signal is nonlinearly dependent on the signal magnitude a. The nonlinear function is described by the generalized memory spline generator 110.

Figure 6:
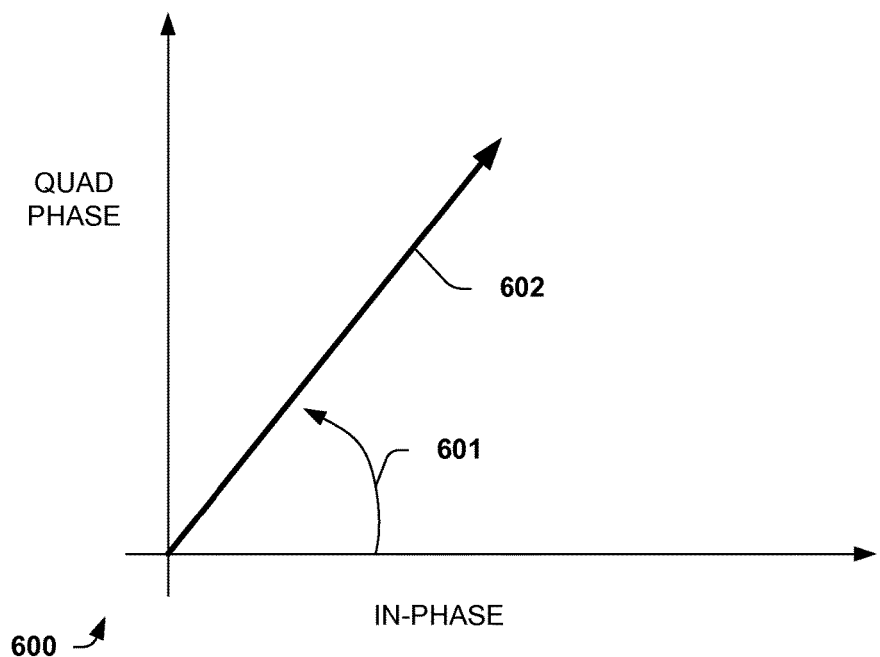
FIG. 6 is a graph illustrating generation of the RF signal by the analog IQ processor 104.

FIG. 6 is a graph 600 illustrating generation of the RF signal 124 by the analog IQ processor 104. The graph 600 is provided for illustrative purposes and to facilitate understanding.

An x-axis depicts magnitude of an in-phase component/phase of the RF signal 124 and a y-axis depicts magnitude of a quadrature phase of the RF signal 124. An angle or phase of the RF signal 124 is shown by an angle 601. A line 602 depicts the magnitude of the RF signal 124.

The line 602 is obtained by the formula:

$$a\sqrt{f_1^2(a)+f_2^2(a)}$$

The angle 601 is obtained by the formula:

$$\arctan\left\{\frac{f_2(a)}{f_1(a)}\right\}$$

The memory spline generator 110 generates the non-linear functions 120. Referring to the spline generator 110 shown in FIG. 5, a first non-linear function can be obtained by:

$$f_1(a(t), \cdots, a(t-\tau_M)) = c_0 + \sum_{m=0}^{M}\left(c_{1m}a(t-\tau_m) + \sum_{k=2}^{K} c_{km}|a(t-\tau_m) - \beta_k|\right)$$

and a second non-linear function can be obtained by:

$$f_2(a(t), \cdots, a(t-\tau_m)) = d_0 + \sum_{m=0}^{M}\left(d_{1m}a(t-\tau_m) + \sum_{k=2}^{K} d_{km}|a(t-\tau_m) - \beta_k|\right)$$

where $\tau_0=0$, K denotes the number of segments, $\beta_k$ define the segment boundaries for the normalized input signal magnitude $0 \leq a(t) \leq 1$, and M denotes the memory depth. The memory spline generator 110 uses programmable parameter vectors to define the desired non-linear functions. The programmable vectors are shown as:

$$c = [c_0, c_{10}, c_{20}, \ldots, c_{K0}, c_{11}, c_{21}, \ldots, c_{K1}, c_{K2} \ldots, c_{KM}],$$

$$d = [d_0, d_{10}, d_{20}, \ldots, d_{K0}, d_{11}, d_{21}, \ldots, d_{K1}, d_{K2} \ldots, d_{KM}], \text{ and } \beta = [\beta_2 \beta_3, \ldots, \beta_K]$$

The programmable vectors c, d and β, also referred to as the pre-distortion parameters 114, are obtained via a digital interface from the parameter generator 112.

Figure 7:
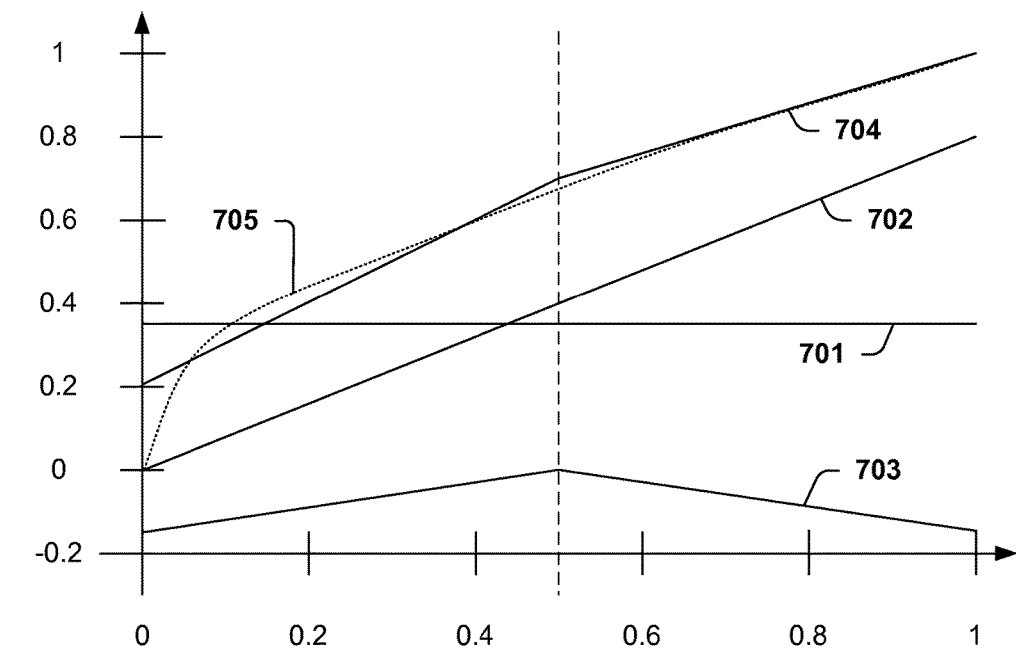
FIG. 7 is a graph illustrating generation of non-linear functions for a square root function using the spline generator and the parameter generator.

FIG. 7 is a graph 700 illustrating generation of non-linear functions for a square root function using the spline generator 110 and the parameter generator 112.

Line 705 represents a square root function given by $\sqrt{a}$ where $a \in [0,1]$ with a simple spline using K=2 segments with a segment boundary $\beta_2 = 0.5$. Line 701 is a constant given by $c_0$. The line 702 is a linear portion of the formula represented by $c_1 a$. The piece-wise affine function is represented by line 703 and is given by $c_2 |a - \beta_2|$ and yields the spline/non-linear approximation shown by line 704 which combines 701, 702 and 703.

Thus, line 704 represents a spline/non-linear approximation of the square root formula using two segments and without memory. A more precise approximation can be obtained by increasing the number of segments.

It is appreciated that power amplifiers can have non-linear memory effects as part of their non-linear behavior. Memory terms are used to represent and account for these non-linear memory effects. The memory terms are shown above as $a(t - \tau_m)$.

Figure 8:
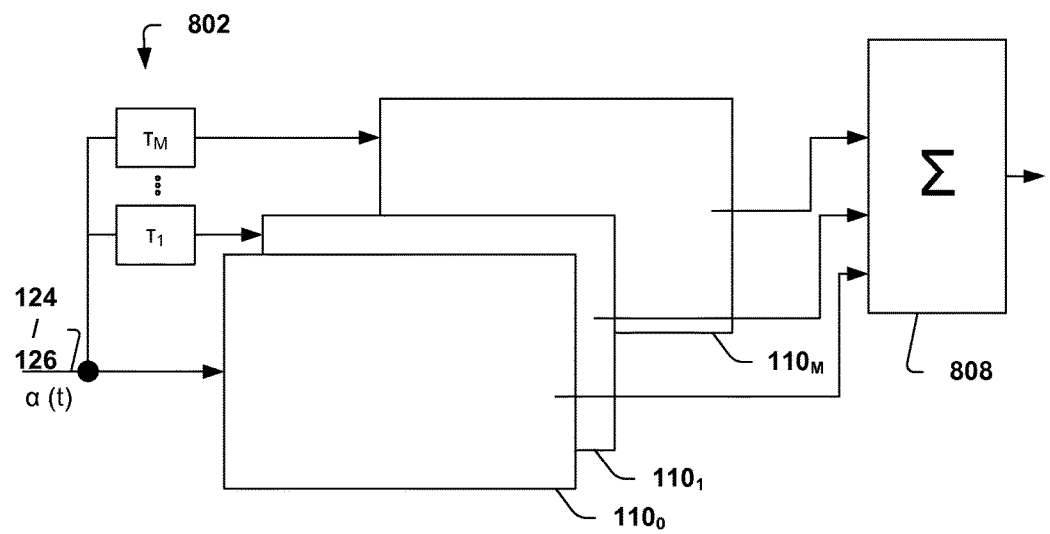
FIG. 8 is a block diagram depicting a memory spline generator having multiple memory terms.

FIG. 8 is a block diagram depicting a memory spline generator having multiple memory terms. The multiple memory terms are used to generate non-linear functions 120 that represent non-linear memory effects.

The spline generator of FIG. 8 includes delay elements 802, a plurality of memory spline generators $110_0$, $110_1, \ldots 110_M$, referred to collectively as 110, and a memory summation component 808. Each individual spline generator operates as shown in FIG. 5.

The delay elements 802 delay the signal or envelope 124 by a delay amount from 1 to M. Thus, each spline generator 110 generates a varied spline/non-linear function based on its input. For example, the spline generator $110_0$ generates a spline based on a delay of zero or no delay. The spline generator $110_1$ generates a spline based on a delay of $T_1$. Continuing, the spline generator $110_M$ generates a spline delay based on a delay of $T_M$. The summation component 808 adds the outputs of the spline generators 110 to provide a collective non-linear function.

Figure 9:
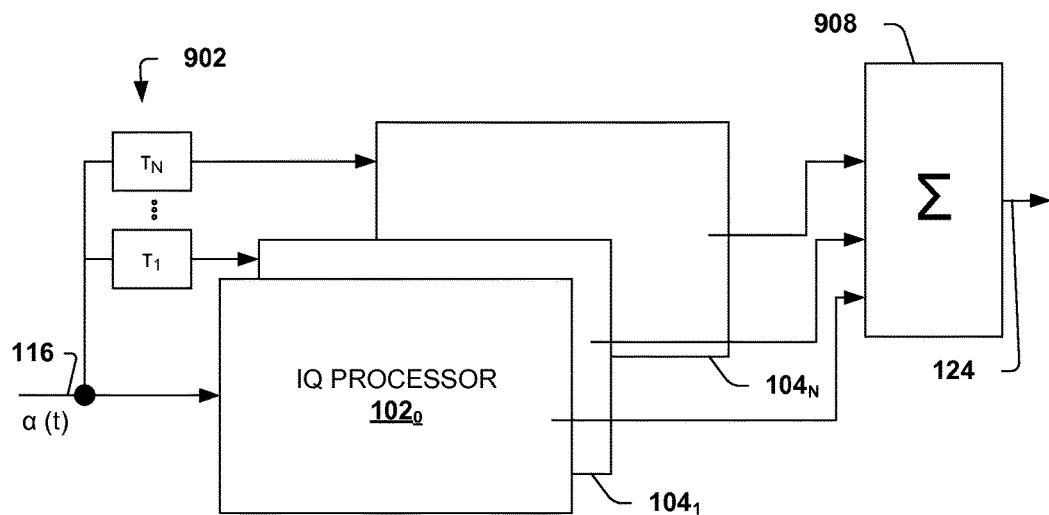
FIG. 9 is a block diagram illustrating an RF transmitter system incorporating an analog pre-distorter and having multiple delays.

FIG. 9 is a block diagram illustrating an RF transmitter system 900 incorporating an analog pre-distorter and having multiple delays. The multiple delays are used by a plurality of analog IQ processors to generate a plurality of RF signals. The plurality of RF signals are combined to yield a single RF signal. Portions of the system 900, such as lower bandwidth circuitry, and a power amplifier are omitted to facilitate understanding.

The system 900 includes a plurality of delay elements 902, a plurality of analog IQ processors 104 and a summation component 908. A first IQ processor $104_0$ receives an input/original signal 116 that has been generated by lower bandwidth circuitry. A second IQ processor $104_2$ receives the input signal 116 after being delayed by a delay element $T_1$. An n-th IQ processor $104_N$ receives the input signal 116 after being delayed by a delay element $T_N$.

The analog IQ processors 104 receive non-linear functions 120 from a spline generator. In one example, the spline generator provides the same non-linear functions to all of the analog IQ processors 104. In another example, the spline generator provides different non-linear functions to each of the analog IQ processors 104.

The plurality of IQ processors 104 generate a plurality of RF output signals. These signals are combined or added by the summation component 908 to generate an RF output signal 124.

Figure 10:
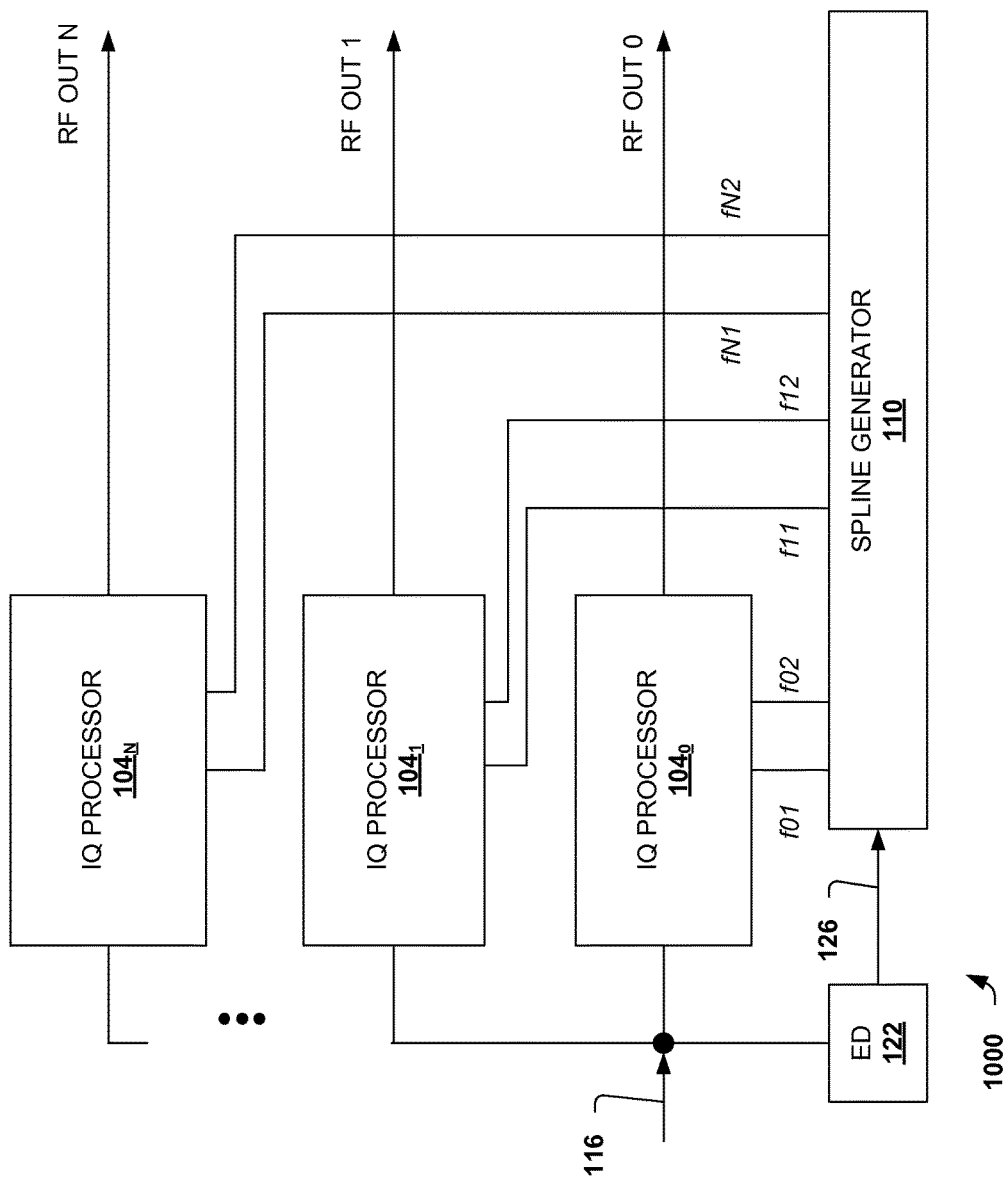
FIG. 10 is a diagram illustrating an RF transmitter system utilizing a plurality of analog IQ processors.

FIG. 10 is a diagram illustrating an RF transmitter system 1000 utilizing a plurality of analog IQ processors. The system 1000 operates the plurality of analog IQ processors in parallel to enhance linearity and efficiency.

The system 1000 omits some elements in order to simplify the diagram and facilitate understanding.

The system 1000 includes a plurality of analog IQ processors 104, an envelope detector 122 and a spline generator 110. The envelope detector 122 detects or obtains an envelope 126 of an input/original signal 116. The spline generator 110 uses the envelope along with pre-distortion parameters 114 to generate a plurality of non-linear function pairs. Each pair includes an upper function and a lower function. The upper function is also referred to as the in-phase non-linear function and the lower function is also referred to as the quadrature non-linear function. Thus, the spline generator 110 generates N+1 pairs of non-linear functions.

Each IQ processor receives an associated pair of non-linear functions and generates an RF output from the input signal 116. The respective RF outputs are summed together and provided as a single RF output signal.

Figure 11:
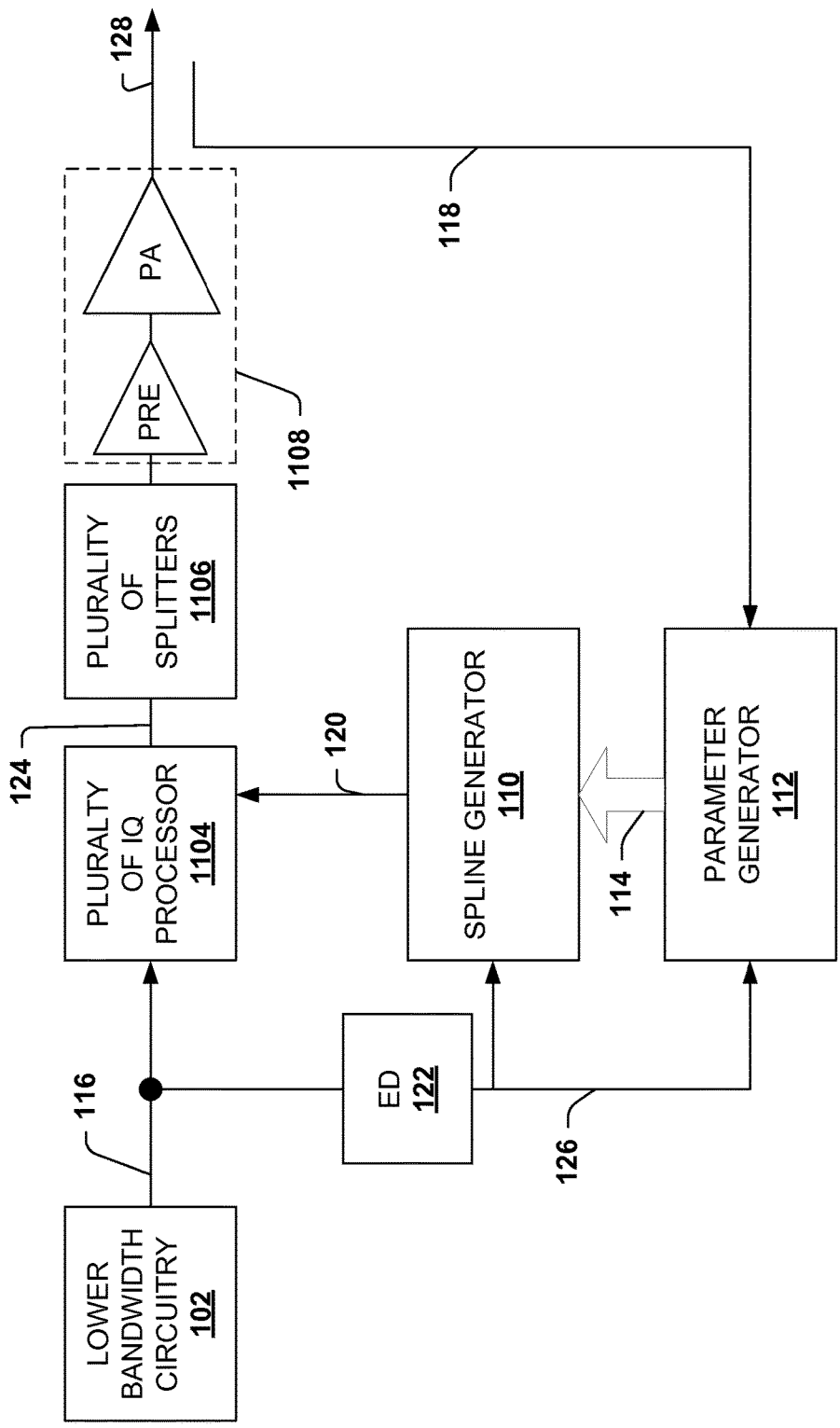
FIG. 11 is a diagram illustrating an RF transmitter system utilizing a plurality of analog IQ processors and a plurality of bandwidth splitters.

FIG. 11 is a diagram illustrating an RF transmitter system 1100 utilizing a plurality of analog IQ processors and a plurality of bandwidth splitters.

The system 1100 is similar to the system 100 described above and the description of the system 100 can be references for additional description.

The system 1100 includes a plurality of analog IQ processors 1104 that generate a plurality of RF output signals. These signals are combined into a single RF output signal 124.

The system 1100 also includes a plurality of splitters 1106. The splitters segment the RF output signal into a plurality of segments based on bandwidth or spectrum. Each splitter has an associated amplifier chain that generates a transmission signal. The associated amplifier chain is of a plurality of amplifier chains 1108 and typically includes a pre-amplifier and a power amplifier.

The plurality of amplifier chains 1108 generate a plurality of transmission signals that are combined, such as by a power combiner, into a single signal.

Figure 12:
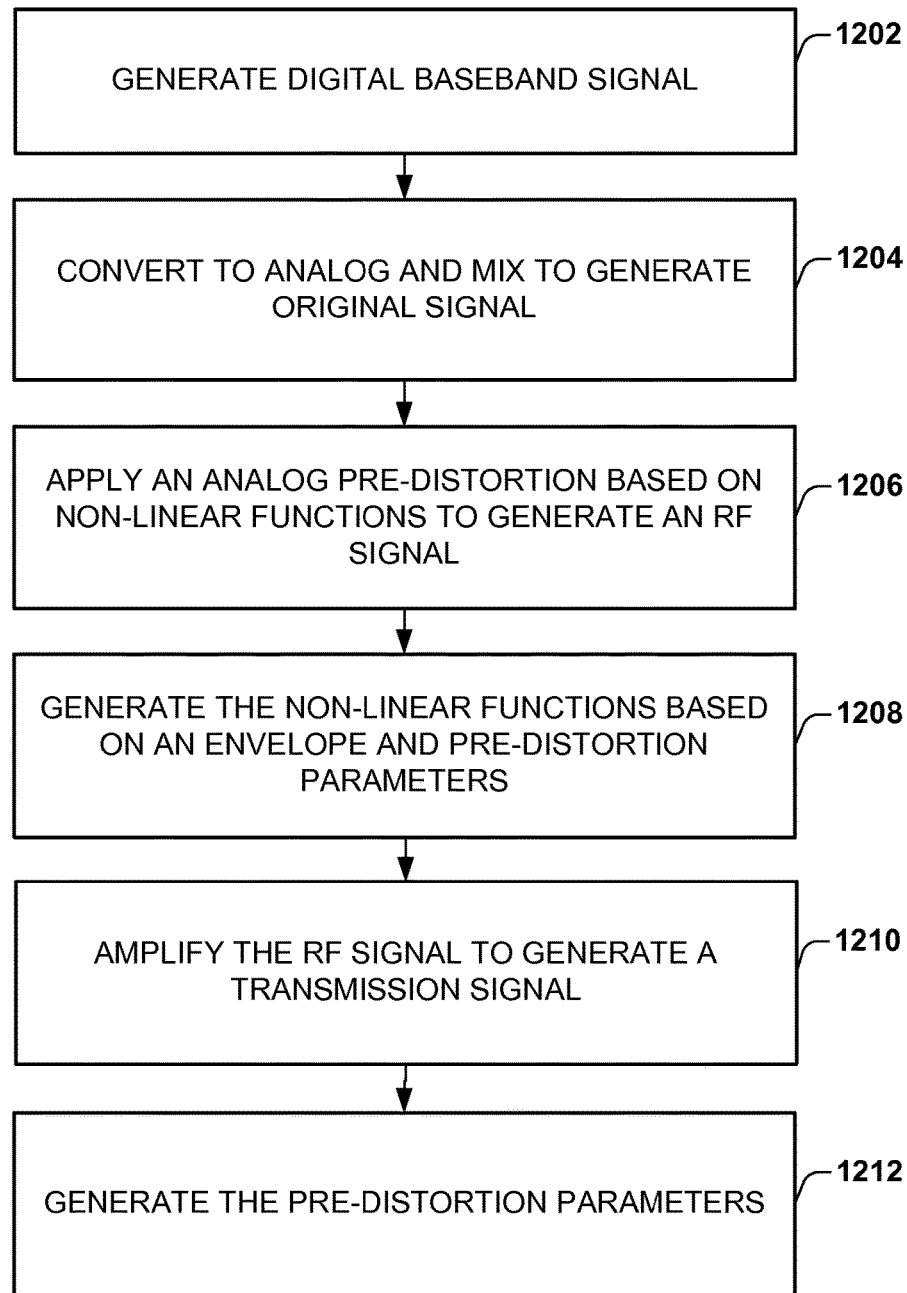
FIG. 12 is a flow diagram illustrating a method of operating an analog pre-distorter.

FIG. 12 is a flow diagram illustrating a method 1200 of operating an analog pre-distorter. The method 1200 applies a non-linear pre-distortion in an analog domain instead of the digital domain. As a result, the spectrum of the signal is maintained to an original width and the required bandwidth of the signal is reduced. The non-linear pre-distortion accounts for non-linear behavior of a power amplifier or other component.

The method begins at block 1202 where a baseband processor of lower bandwidth circuitry generates a digital baseband signal. The digital baseband signal includes information content.

Digital to analog converters and mixers of the lower bandwidth circuitry convert and mix the digital baseband signal to generate an analog original signal at block 1204. The analog original signal is at an original spectrum width in that is has not been widened as in digital pre-distortion. The analog original signal includes a modulation scheme.

An analog IQ processor applies a pre-distortion to the analog original signal to generate an RF signal at block 1206. The pre-distortion is based on one or more non-linear functions. The IQ processor, in one example, includes a phase shift component that splits a quadrature component from the original signal. The original signal is mixed with a first non-linear function to generate a mixed in-phase signal and the quadrature component is mixed with a second non-linear function to generate a mixed quadrature signal. The mixed in-phase signal and the mixed quadrature signal are combined to provide the RF signal.

A spline generator generates the one or more non-linear functions based on an envelope of the original signal and pre-distortion parameters at block 1208. In one example, the spline generator generates the first non-linear function for an upper signal or in-phase component and the second non-linear function for a lower signal or quadrature component. An envelope detector can be used to detect or generate the envelope of the original signal.

A non-linear power amplifier amplifies the RF signal to generate a transmission signal at block 1210. The power amplifier has non-linear behavior, which has been estimated by the one or more non-linear functions. As a result, the transmission signal is generated substantially linear compared to if no linearization would be applied A parameter generator generates the pre-distortion parameters at block 1212 based on a coupled feedback signal and the envelope of the original signal. The parameter generator typically includes a digital control that provides the parameters. In one example, the pre-distortion parameters are in the form of programmable vectors.

While the method is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

It is appreciated that the claimed subject matter may be implemented as a method, apparatus, or article of manufacture using standard programming and/or engineering techniques to produce software, firmware, hardware, or any combination thereof to control a computer to implement the disclosed subject matter (e.g., the systems, arrangements and the like shown in FIGS. 1, 2, etc., are non-limiting examples that may be used to implement the above methods). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

An RF transmitter arrangement using analog pre-distortion is disclosed. The arrangement includes lower bandwidth circuitry, an analog pre-distorter, and a non-linear amplifier chain. The lower bandwidth circuitry is configured to generate an analog signal. The analog pre-distorter is configured to apply a non-linear distortion to the analog original signal based on a coupled feedback signal in order to generate an RF output signal. The non-linear amplifier chain is configured to amplify the RF output signal to generate a transmission signal relative to the analog original signal. The coupled feedback signal is derived from the transmission signal.

Another RF transmitter arrangement is disclosed. The arrangement includes an analog IQ processor, an envelope detector, a spline generator, a parameter generator, and a non-linear power amplifier. The analog IQ processor is configured to generate an RF signal from an analog original signal based on a non-linear function. The envelope detector is configured to obtain an envelope of the analog original signal. The spline generator is configured to generate the non-linear function based on the envelope and pre-distortion parameters. The parameter generator is configured to generate the pre-distortion parameters based on the envelope and a coupled feedback signal. The non-linear power amplifier is configured to generate a transmission signal from the RF signal.

A method of operating an analog pre-distorter is disclosed. A digital baseband signal is converted and mixed to generate an analog original signal without increasing the spectrum width. A non-linear pre-distortion is applied to the analog original signal in the analog domain according to one or more non-linear functions to generate a distorted RF signal. The non-linear function is generated based on an envelope of the analog original signal and pre-distortion parameters. The distorted RF signal is amplified with a non-liner amplifier to generate a transmission signal.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. An RF transmitter arrangement using analog pre-distortion, the arrangement comprising:
   an analog IQ processor configured to apply a non-linear distortion to an analog original signal based on one or more non-linear splines to generate an RF output signal;
   a spline generator configured to generate the one or more non-linear splines based on an envelope of the analog original signal and one or more pre-distortion parameters;
   a parameter generator configured to generate the one or more pre-distortion parameters based on the envelope and a coupled feedback signal; and
   a non-linear amplifier chain configured to amplify the RF output signal to generate a transmission signal relative to the analog original signal, wherein the coupled feedback signal is derived from the transmission signal.

2. The arrangement of claim 1, further comprising lower bandwidth circuitry configured to generate the analog original signal, wherein the lower bandwidth circuitry includes a baseband processor configured to generate a first digital signal and a second digital signal and a first digital to analog converter configured to convert the first digital signal into a first analog signal and a second digital to analog converter configured to convert the second digital signal into a second analog signal.

3. The arrangement of claim 1, further comprising lower bandwidth circuitry configured to generate the analog original signal, wherein the lower bandwidth circuitry includes a mixer to mix a first analog signal with an oscillator signal to generate a first mixed signal and a summation component configured to add the first mixed signal with a second mixed signal to generate the analog original signal, wherein the first mixed signal is at an original bandwidth.

4. The arrangement of claim 1, wherein the non-linear amplifier chain includes a power amplifier that exhibits non-linear behavior.

5. The arrangement of claim 1, wherein the non-linear amplifier chain includes a pre amplifier and a power amplifier serially connected.

6. The arrangement of claim 1, wherein the analog IQ processor is configured to apply a first non-linear function to an in-phase component of the analog original signal and apply a second non-linear function to a quadrature component of the analog signal, wherein the first and second non-linear functions represent non-linear behavior of the non-linear amplifier chain.

7. The arrangement of claim 6, wherein the analog IQ processor includes a phase shift component configured to generate the quadrature component of the analog original signal.

8. The arrangement of claim 1, wherein the spline generator uses segments and memory to estimate non-linear behavior of the non-linear amplifier chain.

9. The arrangement of claim 1, wherein the parameter generator includes a digital controller configured to generate the parameters from a memory based on the coupled feedback signal and the envelope of the analog original signal.

10. An RF transmitter arrangement using analog pre-distortion, the arrangement comprising:
    an analog IQ processor configured to generate an RF signal from an analog original signal based on one or more non-linear splines;
    an envelope detector configured to obtain an envelope of the analog original signal;
    a spline generator configured to generate the non-linear splines based on the envelope and pre-distortion parameters;
    a parameter generator configured to generate the pre-distortion parameters based on the envelope and a coupled feedback signal; and
    a non-linear power amplifier configured to generate a transmission signal from the RF signal.

11. The arrangement of claim 10, further comprising lower bandwidth circuitry configured to generate baseband signals and convert the baseband signals into the analog original signal.

12. The arrangement of claim 10 further comprising a splitter configured to segment the RF signal into a plurality of signal segments and wherein the power amplifier has multiple inputs configured to receive the plurality of signal segments.

13. The arrangement of claim 10, wherein the analog IQ processor includes a plurality of IQ processors configured to process delayed versions of the analog original signal.

14. The arrangement of claim 13, wherein the plurality of IQ processors generate a plurality of RF signals that are provided to multiple inputs of the power amplifier.

15. The arrangement of claim 10, wherein the spline generator is configured to use a number of segments and a memory depth that provide suitable linearization.

16. A method of operating an analog pre-distorter, the method comprising:
    converting and mixing a digital baseband signal to generate an analog original signal without increasing a spectrum;
    applying a non-linear pre-distortion to the analog original signal in an analog domain according to one or more non-linear functions to generate a distorted RF signal;
    generating one or more predistortion parameters based on an envelope of the analog original signal and a coupled feedback signal;
    generating the one or more non-linear functions based on the envelope of the analog original signal and the one or more pre-distortion parameters; and
    amplifying the distorted RF signal with a non-liner amplifier to generate a transmission signal.

17. The method of claim 16, wherein applying the non-linear pre-distortion comprises separating the analog original signal into an in-phase component and a quadrature component and mixing the in-phase component with a first non-linear function and mixing the quadrature component with a second non-linear function.

18. The method of claim 16, further comprising generating the one or more pre-distortion parameters based on a coupled feedback signal of the transmission signal.

* * * * *